United States Patent
Yui et al.

(10) Patent No.: US 6,992,307 B2
(45) Date of Patent: Jan. 31, 2006

(54) ELECTRON BEAM SOURCE AND ELECTRON BEAM EXPOSURE APPARATUS EMPLOYING THE ELECTRON BEAM SOURCE

(75) Inventors: Yoshikiyo Yui, Tochigi (JP); Hiroya Ohta, Kodaira (JP)

(73) Assignees: Canon Kabushiki Kaisha, Tokyo (JP); Hitachi High-Technologies Corp., Tokyo (JP)

( * ) Notice: Subject to any disclaimer, the term of this patent is extended or adjusted under 35 U.S.C. 154(b) by 0 days.

(21) Appl. No.: 10/873,250

(22) Filed: Jun. 23, 2004

(65) Prior Publication Data

US 2004/0262539 A1 Dec. 30, 2004

(30) Foreign Application Priority Data

Jun. 26, 2003 (JP) .............................. 2003-182364

(51) Int. Cl.
*H01J 29/70* (2006.01)
*A61N 5/00* (2006.01)
*G21G 5/00* (2006.01)

(52) U.S. Cl. .............................. 250/492.2; 250/492.1; 250/492.3; 250/505.1; 313/336

(58) Field of Classification Search .. 250/492.1–492.3, 250/492.22, 492.23, 505.1; 313/448, 449, 313/336, 413, 421
See application file for complete search history.

(56) References Cited

U.S. PATENT DOCUMENTS

| 3,835,327 | A | * | 9/1974 | Lawrence | 250/398 |
| 4,628,226 | A | * | 12/1986 | Kurz et al. | 315/102 |
| 4,740,705 | A | * | 4/1988 | Crewe | 250/423 F |
| 4,914,724 | A | * | 4/1990 | Chevalier et al. | 315/382 |
| 5,155,412 | A | * | 10/1992 | Chang et al. | 315/14 |
| 5,763,893 | A | | 6/1998 | Nakasuji | 250/492.2 |
| 5,783,905 | A | * | 7/1998 | Greschner et al. | 313/497 |
| 5,854,490 | A | | 12/1998 | Ooaeh et al. | 250/492.23 |
| 5,872,366 | A | | 2/1999 | Ooaeh et al. | 250/492.2 |
| 5,949,078 | A | | 9/1999 | Ooaeh et al. | 250/492.2 |
| 5,962,859 | A | * | 10/1999 | Groves et al. | 250/492.23 |
| 6,483,120 | B1 | | 11/2002 | Yui et al. | 250/491.1 |
| 6,515,409 | B2 | * | 2/2003 | Muraki et al. | 313/359.1 |
| 6,593,686 | B1 | * | 7/2003 | Yui | 313/449 |
| 6,815,875 | B2 | * | 11/2004 | Kuo et al. | 313/309 |

(Continued)

FOREIGN PATENT DOCUMENTS

JP  9-129166  5/1997

(Continued)

*Primary Examiner*—John R. Lee
*Assistant Examiner*—Bernard E W. Souw
(74) *Attorney, Agent, or Firm*—Fitzpatrick, Cella, Harper & Scinto (57) ABSTRACT

An electron gun is composed of a hemispherical cathode (1) and a second bias electrode (8) having apertures (9, 7, 11) along an optical axis of an electron beam fired from the electron gun, a first bias electrode (6) and an anode (10), arranged in that order, as well as a controller for variably controlling an electric potential applied to the first and second bias electrodes. The controller, for example, holds the sum of the electric potentials of the first and second bias electrodes relative to the cathode (1) substantially constant. Further, by adding one or more third bias electrode(s) (20) between the first and second bias electrodes (6, 8) as necessary, the intensity of the electron beam discharged from the high-intensity, high-emittance electron gun can be adjusted without affecting the current density angular distribution.

6 Claims, 9 Drawing Sheets

U.S. PATENT DOCUMENTS

2002/0008207 A1 1/2002 Muraki et al. ............... 250/398
2003/0122087 A1 7/2003 Muraki et al. ............ 250/492.2
2004/0206919 A1 * 10/2004 Okunuki et al. ........ 250/492.22
2004/0262539 A1 * 12/2004 Yui et al. ................. 250/492.1

FOREIGN PATENT DOCUMENTS

| JP | 9-180663 | 7/1997 |
| JP | 9-260237 | 10/1997 |
| JP | 2000-285840 | 10/2000 |

* cited by examiner

ELECTRON BEAM SOURCE AND ELECTRON BEAM EXPOSURE APPARATUS EMPLOYING THE ELECTRON BEAM SOURCE

FIELD OF THE INVENTION

The present invention relates to an electron beam source including a bias control circuit that controls an electron gun and its bias electrode electric potential, as well as an electron beam exposure apparatus employing the electron beam source, and more particularly, to a high-throughput, high-accuracy electron beam source employed in a multi-beam drawing apparatus for use in the lithography step in the process of producing a semiconductor device such as a dynamic random access memory (hereinafter "DRAM") having a capacity of 4-plus gigabits.

BACKGROUND OF THE INVENTION

Conventionally, an electron beam exposure apparatus has long been used to produce masks that are the templates for semiconductor devices such as DRAMs and MPUs (microprocessing units). In the last several years, as advances in the resolutions that these electron beam exposure apparatuses are capable of achieving have led to ever-denser semiconductor production processes, such electron beam exposure apparatuses have been applied to exposure devices used in the lithographic part of the production process. Currently, a so-called direct draw-type electron beam exposure apparatus has been proposed as an apparatus capable of being adapted to the design rules of 4-gigabit DRAMs and more, in which electron beams discharged from an electron gun are concentrated and directed by a deflecting system, an electromagnetic lens or the like at the point of concentration onto a semiconductor substrate so as to draw directly on the substrate.

However, there are several problems with attempting to adapt such an apparatus to the semiconductor device mass production process, of which the most important is the drawing speed, with a high throughput of from several tens to several hundreds of times that of a so-called mask drawing unit required. As one means of solving this problem there is a so-called multi-beam-type electron beam exposure apparatus, in which the electron beam discharged from the electron gun is divided into a plurality of beams, for example 1,000, and arranged in the form of a matrix, and the beams used simultaneously to draw on the substrate specimen. A multi-beam electron beam exposure apparatus's ability to draw patterns simultaneously across a wide area using a plurality of electron beams can achieve dramatic improvements in through-put.

This type of apparatus, that is, an electron gun that draws directly on the substrate using a plurality of electron beams arrayed over a broad area, requires a certain electron beam intensity in order to draw a pattern directly with the divided electron beams. Moreover, because a single electron beam is divided into a plurality of beams over a wide area, the angular current density distribution of the beam must be flat and therefore the emittance must also be large. Ordinarily the intensity and the emittance are conservative levels whose values are determined by the electron gun that serves as the light source of the apparatus.

The basic structure of the electron gun employed in the conventional electron beam exposure apparatus involves a cathode in which the tip is shaped into a projection or sharpened to a point in order to increase the intensity, a Wehnelt for concentrating the electrons emitted from the cathode, to which is applied an electric potential lower than the voltage applied to the cathode, and an anode having a ground electrode. This tripolar type of electron gun is simple and easy to operate, and is widely used. However, because this type of electron gun is geared to increasing the intensity of the beam, and therefore it is very difficult to satisfy the required flatness of angular current density distribution over a wide area as described above.

Figure 6:
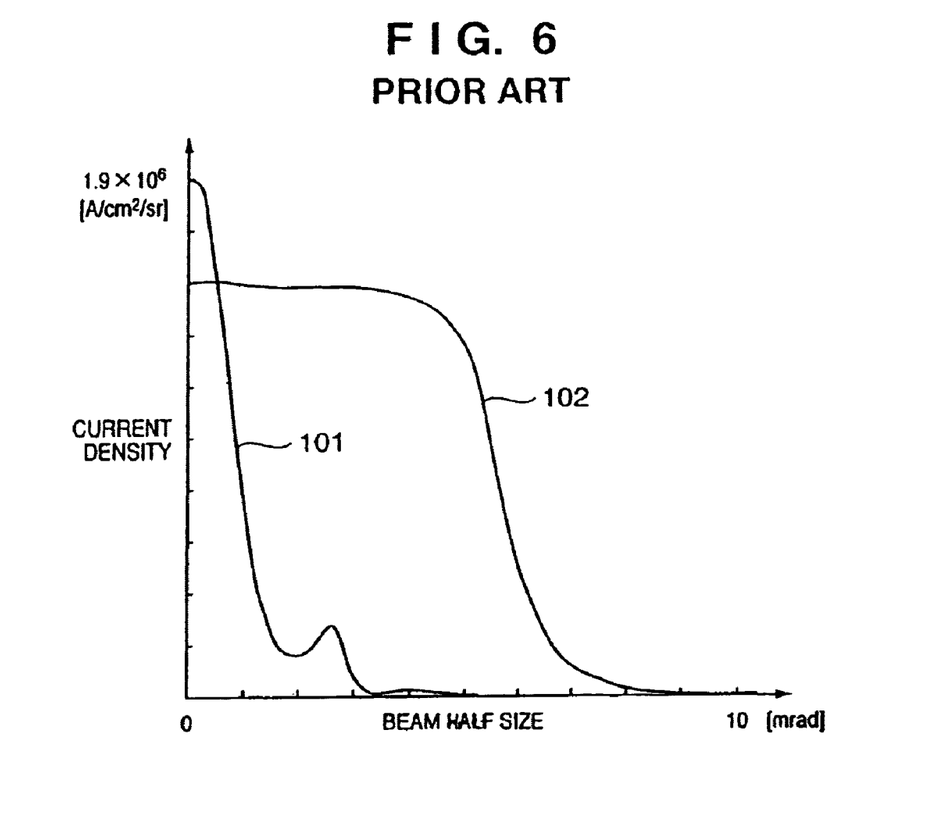
FIG. 6 is a graph showing typical angular current density distribution in a conventional, ordinary electron gun and high-intensity, high-emittance electron gun.

In order to solve the foregoing problem, for example, Japanese Laid-Open Patent Publication (Kokai) No. 2000-285840 discloses a tripolar structure in which the cathode (the electron discharge surface of which is shaped into a hemisphere), the bias electrode and the anode are aligned on the optical axis, with a distance from a center of an aperture in the bias electrode to the tip of the electron discharge surface of the cathode being approximately equal to or slightly greater than a radius of the aperture of the bias electrode, and as a result achieving the desired flatness of angular current density distribution while maintaining relatively high intensity. FIG. 6 shows one example comparing the angular current density distributions of the electron gun described above and an electron gun having the typical tripolar configuration. In the diagram, 101 indicates the angular current density distribution of the typical tripolar configuration and 102 indicates the angular current density distribution of an electron gun employing a hemispherical cathode. As can be seen from the diagram, the electron gun employing the hemispherical cathode has a larger flat portion than that of the electron gun employing the typical tripolar configuration. By optically processing and then spatially dividing this flat portion, the electron gun employing the hemispherical cathode can provide the type of multiple high-intensity electron beams described above.

It should be noted that similar technologies are disclosed in other publications, for example, Japanese Laid-Open Patent Publication (Kokai) No. 9-129166, Japanese Laid-Open Patent Publication (Kokai) No. 9-180663 and Japanese Laid-Open Patent Publication (Kokai) No. 9-260237.

When laying particular emphasis on accuracy in actual lithography, it is necessary simultaneously to draw while controlling any drift in the characteristics of the apparatuses and to increase the resolving power of the parameters. The electron gun described above uses only the flat portion of the angular current density distribution, with the remaining portions being cut off at an appropriate location by an aperture. Such shielding of the current generates heat, and is cooled by a variety of methods to control temperature changes. At the same time, the drawing accuracy demanded of apparatuses of this generation does not permit fluctuations in the performance of the electro-optical system due to slight changes in temperature. For this reason, it is preferable that the absolute amount of the cut-off current be as small as possible.

In addition, as patterns have become finer, so too, the importance of the accuracy of various fine adjustments during drawing, such as proximity effect correction, auxiliary exposure for form correction, etc., has increased. For example, it is necessary to fine-tune the exposure energy and draw the pattern and auxiliary pattern so as to further improve form accuracy. In order to achieve this objective, it is necessary to increase the control resolving power of the exposure energy amount of the drawing apparatus as much as possible. From this standpoint, it is preferable to be able to constantly change the intensity of the electron gun to suit the process and other such drawing conditions.

Figure 7:
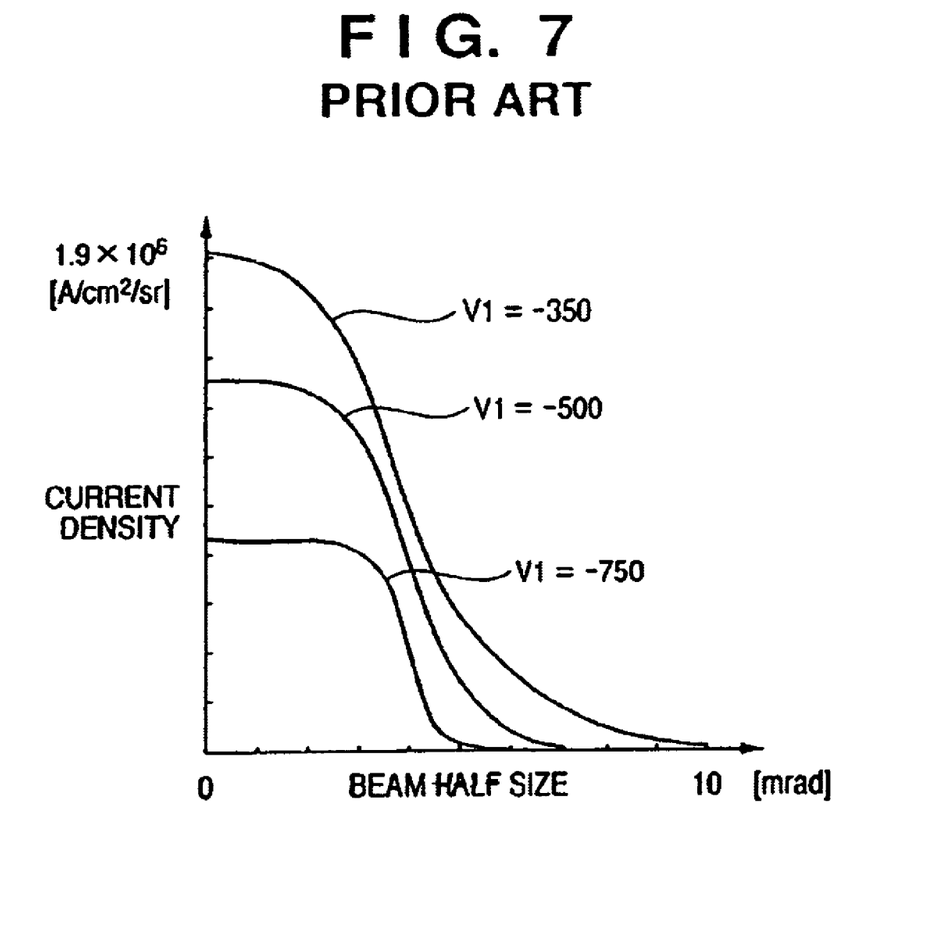
FIG. 7 is a graph showing angular current density distribution in a conventional electron gun when bias voltage is changed.

However, in the electron gun of the tripolar structure described above, intensity adjustment is accomplished by fine adjustment of either the anode voltage or the bias voltage. Of these two methods, that of finely adjusting the anode voltage is difficult to adapt to lithographic apparatuses because the energy of the electrons ultimately obtained changes. In addition, with the bias voltage adjustment method as well, typically, as the intensity changes the angular current density distribution also changes. FIG. 7 shows one example of the relation between the bias voltage V1 and the angular current density distribution, in a tripolar electron gun having a rounded cathode. As can be understood from the graph in FIG. 7, the intensity changes as the bias voltage V1 changes, and at the same time the angular current density distribution also changes, changing the flatness. If the electron beam is split under these conditions, the strength of the individual beams obtained from the split can be uneven, thus degrading the drawing characteristics of the apparatus.

SUMMARY OF THE INVENTION

The present invention has been conceived as a solution to the above-described drawbacks of the conventional art, and has as its object to provide an electron beam source capable of changing the intensity of the electron beam while maintaining the current density angular distribution characteristics of the electron gun unchanged, and further, to provide a variety of electron beam-adapting apparatuses employing such an electron beam source, in particular a high throughput electron beam exposure apparatus.

The above-described object of the present invention is achieved by an electron beam source comprising:

a cathode having a hemispherical electron discharge surface;

an anode disposed opposite the cathode and having a first aperture on an optical axis;

a first bias electrode disposed between the cathode and the anode, to which is applied an electric potential that is lower than an electric potential to the cathode, and having a second aperture on the optical axis that is larger than the electron discharge of the cathode; and a second bias electrode disposed adjacent to the cathode as seen from the first bias electrode, to which is applied an electric potential that is lower than an electric potential to the cathode, and having a third aperture on the optical axis that is larger than the electron discharge surface of the cathode; and a controller that controls the electric potential applied to the first bias electrode and the electric potential applied to the second bias electrode.

According to the above-described invention, the first bias electrode and the adjacent bias electrode are each controlled independently, and therefore can provide an electron beam source capable of continuously changing intensity while maintaining the angular current density distribution.

Preferably, the above-described electron beam source has a structure such that, in a case where a radius of the second aperture of the first bias electrode is R1, a radius of the third aperture of the second bias electrode, a distance from the tip of the electron discharge surface of the cathode to a center of the second aperture of the first bias electrode is D1, and a distance from the center of the second aperture of the first bias electrode to a center of the third aperture of the second bias electrode on the optical axis is D2, a relation between R1 and R2 is $0.8R1 \leq R2 \leq 1.2R1$ and a relation between D1 and D2 is $0.8D1 \leq D2 \leq 1.2D1$.

According to the above-described invention, the ability to maintain the angular distribution characteristics of the electric current density during intensity adjustment can be further enhanced.

Preferably, the above-described electron beam source has a structure such that the controller, in a case where the electric potential E1 applied to the first bias electrode is a relative electric potential relative to the electric potential of the cathode and the electric potential E2 applied to the second bias electrode is a relative electric potential relative to the electric potential of the cathode, controls the electric potential applied to the first bias electrode and the electric potential applied to the second bias electrode so as to maintain a relation between E1 and E2 such that $0.9k \leq |E1+E2| \leq 1.1k$, where k is a positive constant.

According to the above-described invention, the ability to maintain the angular distribution characteristics of the electric current density during intensity adjustment can be enhanced and can be controlled more easily as well.

Preferably, the above-described electron beam source has a structure such that one or more bias electrodes, to which is applied an electric potential lower than the electric potential applied to the cathode, and which have an aperture on the optical axis larger that the electron discharge surface of the cathode, are aligned between the first bias electrode and the second bias electrode.

According to the above-described invention, adjustment of such characteristics as the location of the crossover and the diameter of the crossover can be simplified.

In addition, the above-described object of the present invention is achieved by an electron beam exposure apparatus comprising:

the electron beam source described above;

a formation system for applying an exposure beam having desired characteristics to the electron beam from the electron beam source;

a deflection system for controlling a position of the exposure beam; and a projection system for concentrating the exposure beam on a substrate that is a specimen and drawing a desired pattern thereon.

Thus, as described above, good maintenance of the angular density distribution of the current density during adjustment of the intensity of the electron gun described above can be adapted to a variety of apparatuses that employ electron beams.

Other features and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

(First Embodiment)

Figure 1:
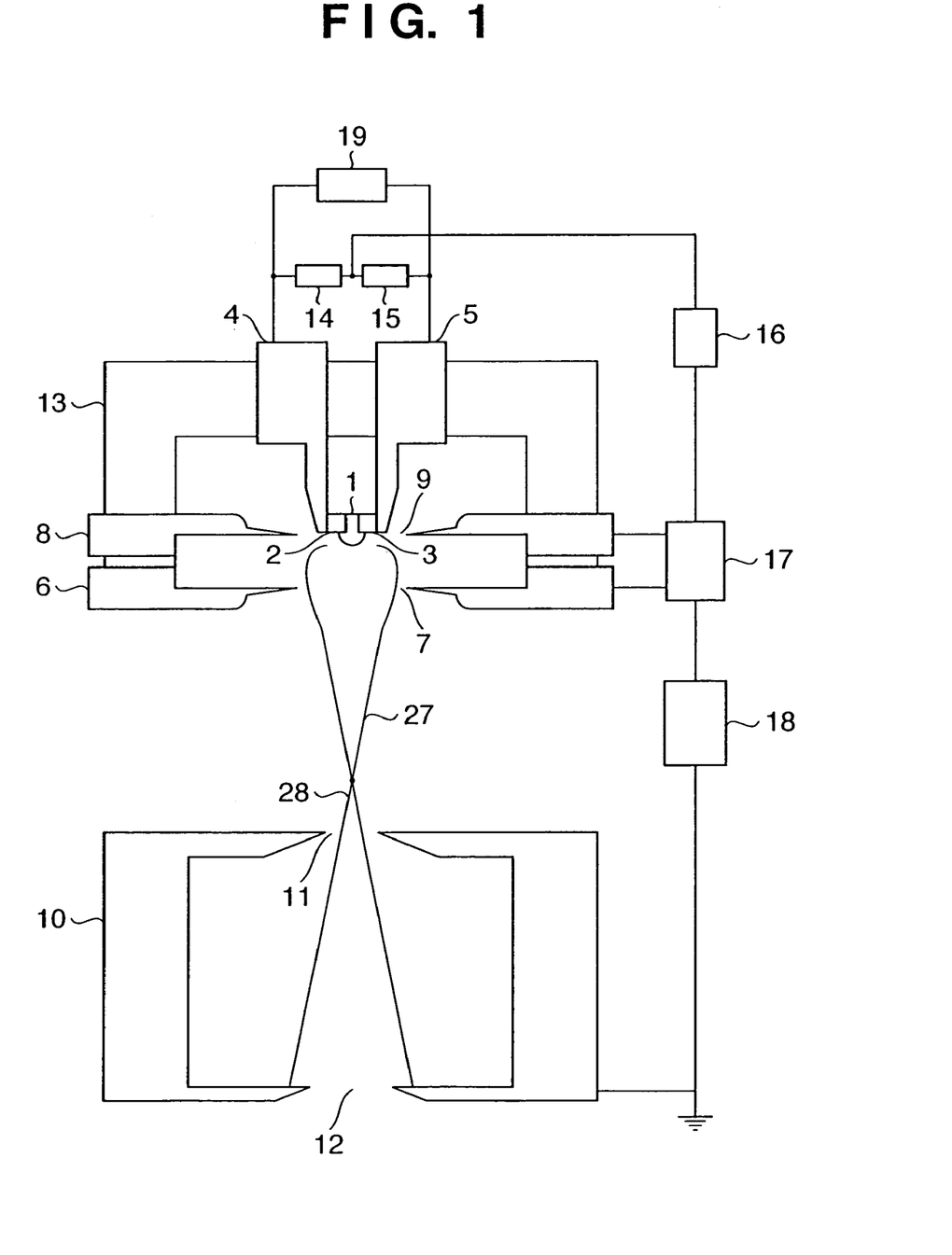
FIG. 1 is a structural diagram of an electron beam source according to a first embodiment of the present invention.

FIG. 1 is a diagram showing the structure of an electron beam source according to a first embodiment of the present invention. In the diagram, reference numeral 1 designates a cathode that releases electrons, 2 and 3 designate heaters that heat the cathode 1, and 4 and 5 designate sub-electrodes that hold the cathode 1 and the heaters 2 and 3 as well as apply an electric potential to the cathode 1 and release an electric current to the heaters 2 and 3. Reference numeral 6 designates a first bias electrode, 7 designates a second aperture, 8 designates a second bias electrode, 9 designates a third aperture, and 10 designates an anode for accelerating the electrodes released from the cathode 1 to a desired energy level. Reference numeral 11 designates a first aperture and reference numeral 12 designates a fourth aperture. In addition, reference numeral 13 designates an insulator for insulating the sub-electrodes 4 and 5 and the bias electrode 6. Reference numerals 14, 15, 16 and 17 designate bias control circuits for applying a desired electric potential to the cathode 1 and the two bias electrodes 6 and 8. Reference numeral 18 designates a high-voltage power source for applying an electric current to the cathode 1 via the bias control circuits 14, 15, 16 and 17. Further, reference numeral 19 designates a heating power source for supplying an electric current to the heaters 2 and 3 and heating the cathode 1. It should be noted that the cathode 1, the first bias electrode 6, the second bias electrode 8, the anode 10 and their associated apertures are coaxially disposed about a central axis that is also the optical axis of the electron beam (hereinafter the "optical axis").

The cathode 1 has an emitter made of a cylindrically shaped single crystal of lanthanum hexaboride (LaB6), a tip of which is fashioned into a hemisphere. The lateral surfaces of the cathode are provided with flat notches that hold the cylinder symmetrically about its axis. Graphite heaters 2 and 3 are fitted into these notches, and are held in place from their outer sides by the sub-electrodes 4 and 5. The cathode 1 is provided with a negative high electric potential by the high-voltage power source 18 via the bias control circuits 14, 15, 16 and 17, which in the present embodiment is −50V. The first bias electrode 6 and the second bias electrode 8 are constructed so as to be capable of separately applying an electric potential equal to or lower than the electric potential applied by the bias control circuits 14, 15, 16 and 17 to the cathode 1. The cathode 1 releases electrons when heated by the supply of electric current to the heaters 2 and 3 from the heating power source 19. A beam 27 of freed electrons is accelerated by the anode 10 and, at the same time, is concentrated by the lens effect of the electric field created by the first bias electrode 6 and the second bias electrode 8 so as to form a crossover 28 in the vicinity of the first aperture 11 of the anode 10. The fourth aperture 12 of the anode 10 acts as a restricting opening, cutting off the peripheral portion of the electron beam 27 so that only the flat angular current density distribution central portion of the beam passes through.

Figure 2:
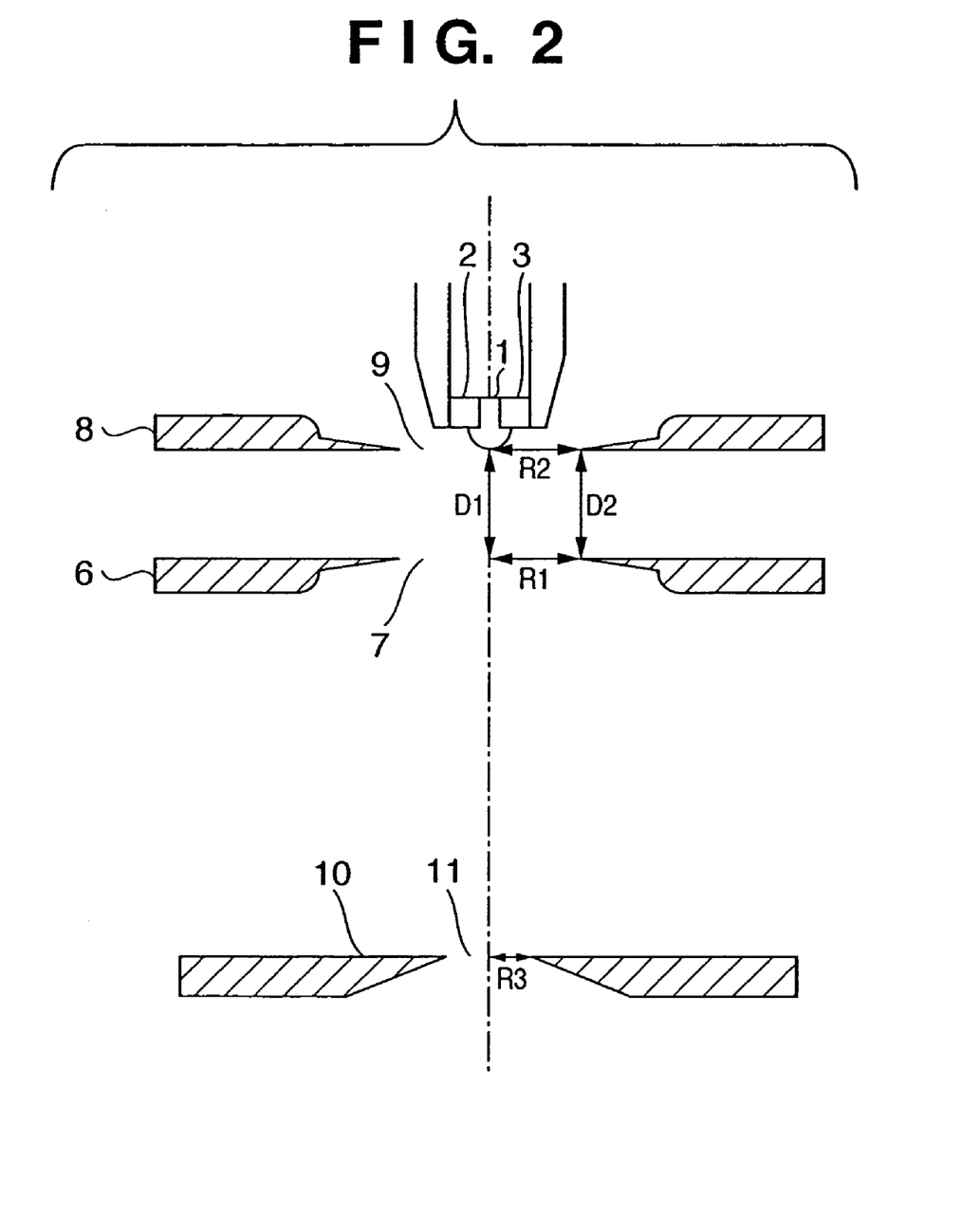
FIG. 2 is a diagram showing a geometric disposition of constituent elements of an electron gun of the electron beam source of FIG. 1.

FIG. 2 shows the geometrical disposition of the cathode 1, the first bias electrode 6, the second bias electrode 8 and the anode 10 of the electron beam source of FIG. 1. In the diagram, a radius of the second aperture 7 of the first bias electrode 6 is R1, a distance from the center of the second aperture to the tip of the electron discharge surface of the cathode 1 is D1, and the relation between R1 and D1 is such that D1 can be adjusted within a range $1.0R1 \leq D1 \leq 1.5R1$. In addition, particularly good characteristics can be obtained when the radius R2 of the third aperture 9 of the second bias electrode is such that $0.8R1 \leq R2 \leq 1.2R1$, and in this embodiment R1=R2. Preferably, a radius r of the hemispherical electron discharge surface is half or less the radius R1 of the second aperture 7 of the first bias electrode 6, and therefore in this embodiment r=R1/6. The position of the second bias electrode 8 on the optical axis can be adjusted within a range such that a distance D2 between the center of the second aperture 7 of the first bias electrode 6 and the center of the third aperture 9 of the second bias electrode 8 is $0.8D1 \leq D2 \leq 1.2D1$. Further, a radius R3 of the first aperture 11 of the anode 10 is smaller than the radius R1 of the second aperture 7 of the first bias electrode 6. In this embodiment R3=R1/2.

Figure 3:
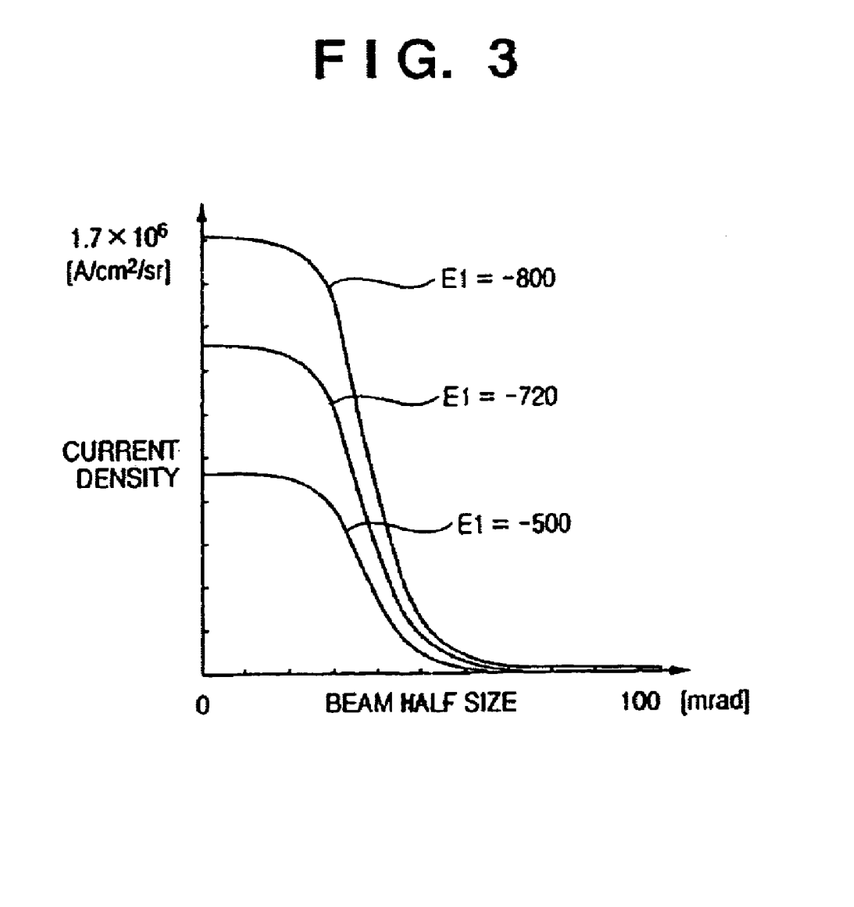
FIG. 3 is a graph showing bias voltage and angular current density distribution in the electron beam source of FIG. 1.

Relative electric potentials E1 and E2 relative to the electric potential of the cathode 1 are applied to the first bias electrode 6 and the second bias electrode 8, respectively, by the bias control circuit 17. In other words, potential differences E1 and E2 are applied between the first bias electrode 6 and the second bias electrode 8 and the cathode 1. FIG. 3 is a graph showing the relation between electric current density and beam half size, that is, between E1 and E2, on the one hand, and intensity on the other, when maintaining a relation k between E1 and E2 such that k (measured in volts) is a positive constant where |E1+E2|=k. In this embodiment, k=1050 [V]. As can be understood from the diagram, by changing E1 and E2 while satisfying the equation |E1+E2|=k described above, the total intensity can be changed without affecting the angular distribution characteristics of the current density even as the intensity changes. In practice, there is a certain permissible range in the margin of deviation from |E1+E2|=k described above, but it can be seen that the desired characteristics can be still obtained provided that the relation $0.9k \leq |E1+E2| \leq 1.1k$ is maintained.

Figure 4:
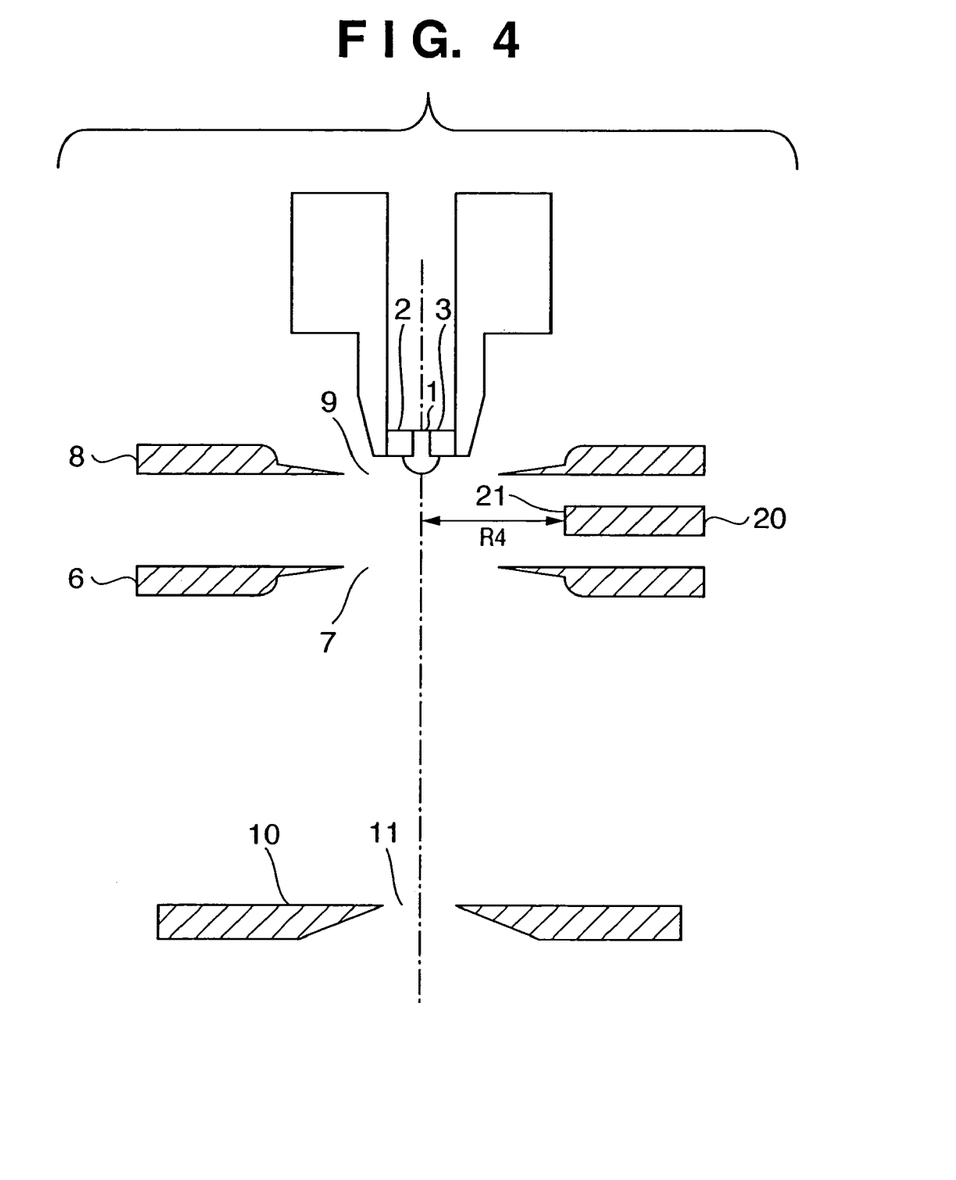
FIG. 4 is a diagram showing a geometric disposition when a third bias electrode is added to the constituent elements of the electron gun of FIG. 2.

As can be appreciated by those of ordinary skill in the art, in the foregoing embodiment, when further a third bias electrode 20 having a fifth aperture 21 is added on the optical axis between the first bias electrode 6 and the second bias electrode 8 as shown in FIG. 4, and accordingly the bias control circuit 17 applies an electric potential E3 to the third bias electrode 20 and the electric potential E3 is changed, a crossover position that is formed by concentrating the electron beam emitted from the cathode 1 can be easily adjusted. In the present embodiment, the electric potential E3 of the third bias electrode 20 is a value intermediate between the applied electric potentials E1 and E2, and a radius R4 of the fifth aperture 21 is larger than the radius R1 of the second aperture 7 and the radius R2 of the third aperture 9. At this time, the practical movable range of the crossover position is approximately 1 mm. Further, the movable range can be further expanded by varying the value of the radius R4 of the fifth aperture 21 and the position along the optical axis of the third bias electrode 20, although caution is required to ensure that such expansion does not affect the current density angular distribution characteristics. Moreover, by changing the cross-sectional shape of the third bias electrode 20 symmetrical about the axis, for example by making the shape a trapezoid, the characteristics of the electron beam thus formed can be fine-tuned. However, the radii of the apertures of the first and second bias electrodes as well as their relative positions and their electric potentials E1, E2 and E3 are all interrelated, and therefore must be determined separately for each such cross-sectional shape of the third bias electrode 20. It should be noted that although in the present embodiment a single crystal of lanthanum hexaboride (LaB6) is used as the source of the electrons, the same effect can be achieved with other electron beam sources as well, for example a metal with a high melting point such as tungsten (W).

(Second Embodiment)

Figure 5:
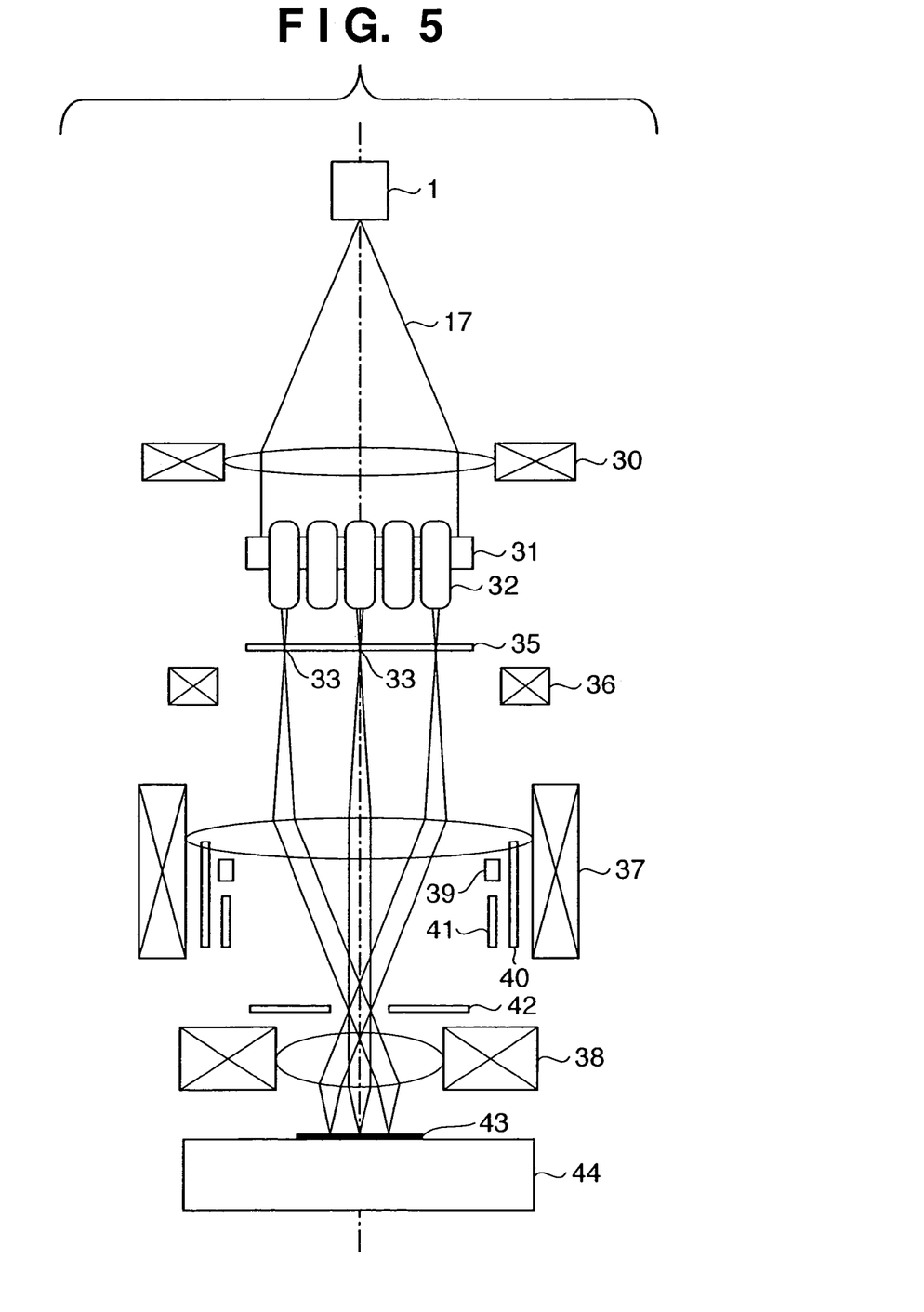
FIG. 5 is a schematic structural diagram showing an electron beam exposure apparatus according to a second embodiment of the present invention employing the electron beam source of FIG. 1.

A description is now given of an electron beam exposure apparatus employing the electron beam source of FIG. 1 according to a second embodiment of the present invention, with reference to FIG. 5.

FIG. 5 is a diagram showing an electron beam exposure apparatus that directly draws a desired pattern on a sample using as a light source the electron beam source of FIG. 1. In the diagram, reference numeral 1 designates the electron beam source of the first embodiment described above that is the light source of the drawing apparatus of this second embodiment, and controls the intensity of the electron beam using the method described above, according to the operating state of the drawing apparatus or the process conditions of the work object. The location of the light source is virtually the same position as the location of the crossover 28 in FIG. 1. The electron beam discharged from this light source is condensed into a substantially parallel electron beam by a condenser lens 30 whose forward focal position is the light source location. The substantially parallel electron beam is then directed into a formation system 31 having a plurality of element electronic optic systems 32, and the parallel beam is divided into a plurality of beams. The element electron optic systems 32, which have blanking electrodes, form a plurality of light source intermediate images 33 in the vicinity of a blanking aperture 35, and at the same time can individually shield each of the plurality of electron beams at the blanking aperture 35 by activating each of the plurality of blanking electrodes.

Next, magnetic field lenses 37 and 38 are arranged in a symmetrical magnetic doublet to form a projection system, with a restricting aperture 42. A distance between the magnetic field lenses 37 and 38 is equal to the sum of the focal lengths of the individual lenses, with the intermediate images 33 of the light source formed at the focal position of the magnetic field lens 37 and their images formed at the focal position of the magnetic lens 38. At this time, the ratio of the focal lengths of the magnetic field lenses 37 and 38 is the projection magnification. Further, since the magnetic fields of the magnetic field lenses 37 and 38 are set so as to work in opposing directions, Seidel aberrations other than the so-called five aberrations (i.e., spherical aberration, isotropic astigmatism, isotropic coma, curvature of field and on-axis chromatic aberration), as well as chromatic aberrations concerning rotation and magnification, are cancelled out.

Reference numeral 40 designates a magnetic field deflector that satisfies convergent magnetic field and MOL conditions and 41 designates an electrostatic deflector for performing deflection with a magnetic field. These two deflectors are used to deflect the electron beams from the plurality of intermediate images and move the images of the plurality of intermediate images 33 in a plane atop the specimen 43. The magnetic field deflector 40 and the electrostatic deflector 41 are used differently depending on the distances the light source images move. Reference numeral 39 designates a dynamic focus coil for correcting a shift in focal position of a light source image caused by the deflection aberration that occurs when the deflectors are actuated. Reference numeral 36 designates a dynamic stig coil for correcting the isotropic astigmatism that occurs by the same process. Reference numeral 43 designates an XYZ stage for moving the specimen 43 in three dimensions. A plurality of laser interferometers provides precision control of the position and movement speed of the XYZ stage 44.

Actual drawing is accomplished by projecting the images of the plurality of intermediate images 33 onto the specimen 43 with the projection system based on pattern data and scanning the surface of the specimen 43 using the magnetic field deflector 40 and the electrostatic deflector 41 while turning the plurality of electron beams on and off by actualizing the blanking electrodes of the plurality of element electronic optic systems 32 and moving the XYZ stage 44 so as to obtain a desired exposure pattern.

It should be noted that the foregoing example is but one embodiment of the present invention, and a variety of configurations can be made without departing from the scope of the present invention when drawing a desired pattern with high resolution over a wide area. Moreover, although the present embodiment adapts the electron beam source of the present invention to an electron beam exposure apparatus, when projection of a high-intensity, high-emittance, wide-area electron beam is required, as can be appreciated by those of ordinary skill in the art, the present embodiment can be immediately adapted to a so-called multi-beam apparatus, in which one of the electron beams is divided into a plurality of electron beams for further application.

The electron beam source of the present invention described above, by aligning two or more bias electrodes in the electron gun and arranging in a desired disposition, and further by controlling the electric potential applied to the individual bias electrodes, can adjust the intensity of the electron beam while maintaining current density angular distribution characteristics.

Further, the electron beam exposure apparatus employing the electron beam source of the present invention makes it possible to both change the intensity of the electron gun that is the light source according to the work object and process conditions without affecting the current density angular distribution characteristics, as well as to achieve both high through-put and high density in a so-called multi-beam drawing apparatus that discharges a plurality of electron beams arrayed over a wide area.

<Embodiment of Semiconductor Production>

Figure 8:
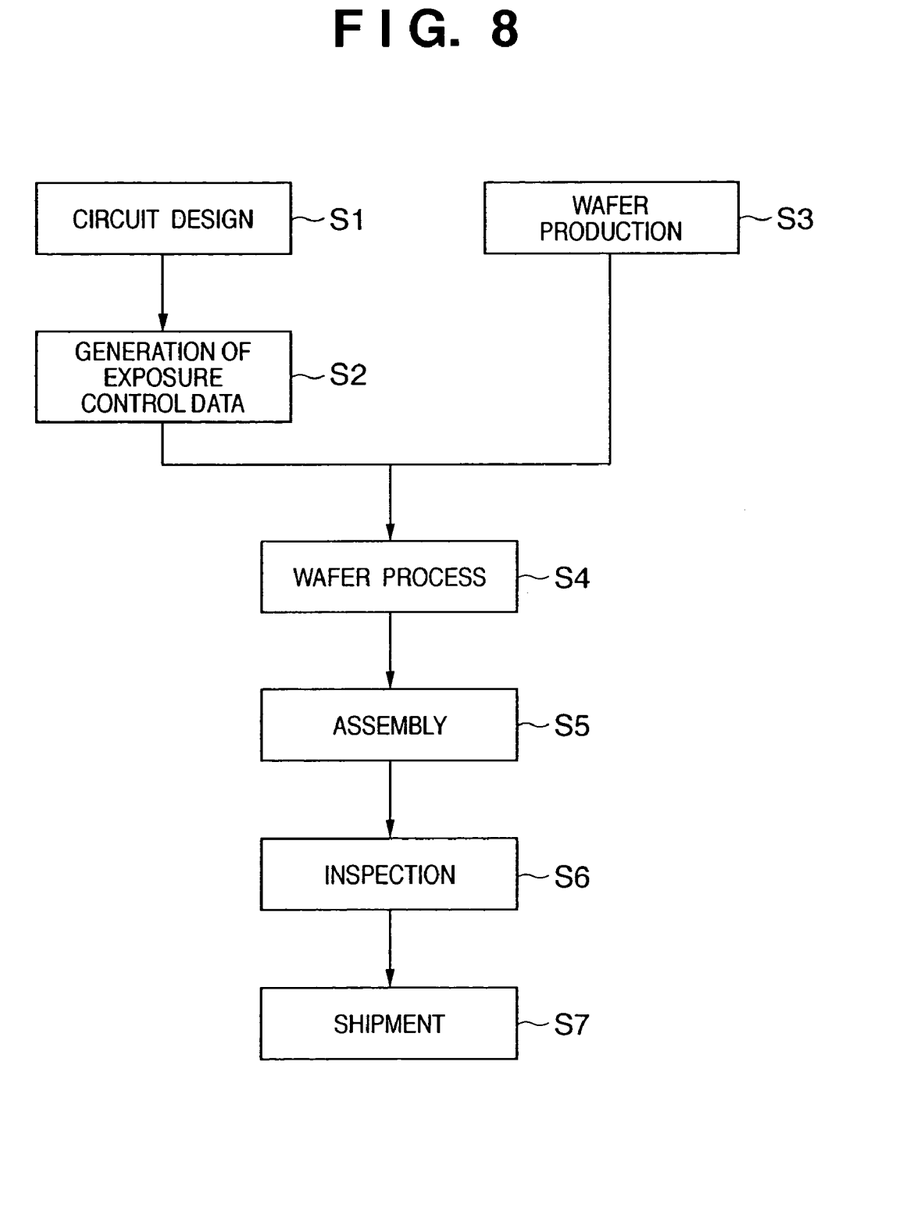
FIG. 8 is a block diagram explaining a flow of an overall device manufacturing process.

Next described is a semiconductor device manufacturing process employing the above-described electron beam exposure apparatus FIG. 8 shows a flow of an overall manufacturing process of a semiconductor device.

In step 1 (circuit design), a circuit of a semiconductor device is designed. In step 2 (generation of exposure control data), exposure control data of the exposure apparatus is generated based on the designed circuit pattern. Meanwhile, in step 3 (wafer production), a wafer is produced with a material such as silicon. In step 4 (wafer process), which is called a pre-process, an actual circuit is formed on the wafer by a lithography technique. In step 5 (assembly), which is called a post-process, a semiconductor chip is manufactured using the wafer produced in step 4. Step 5 includes an assembling process (dicing, bonding), a packaging process (chip embedding) and so on. In step 6 (inspection), the semiconductor device manufactured in step 5 is subjected to inspection such as an operation-check test, durability test and so on. Semiconductor devices are manufactured in the foregoing processes and shipped (step 7).

Figure 9:
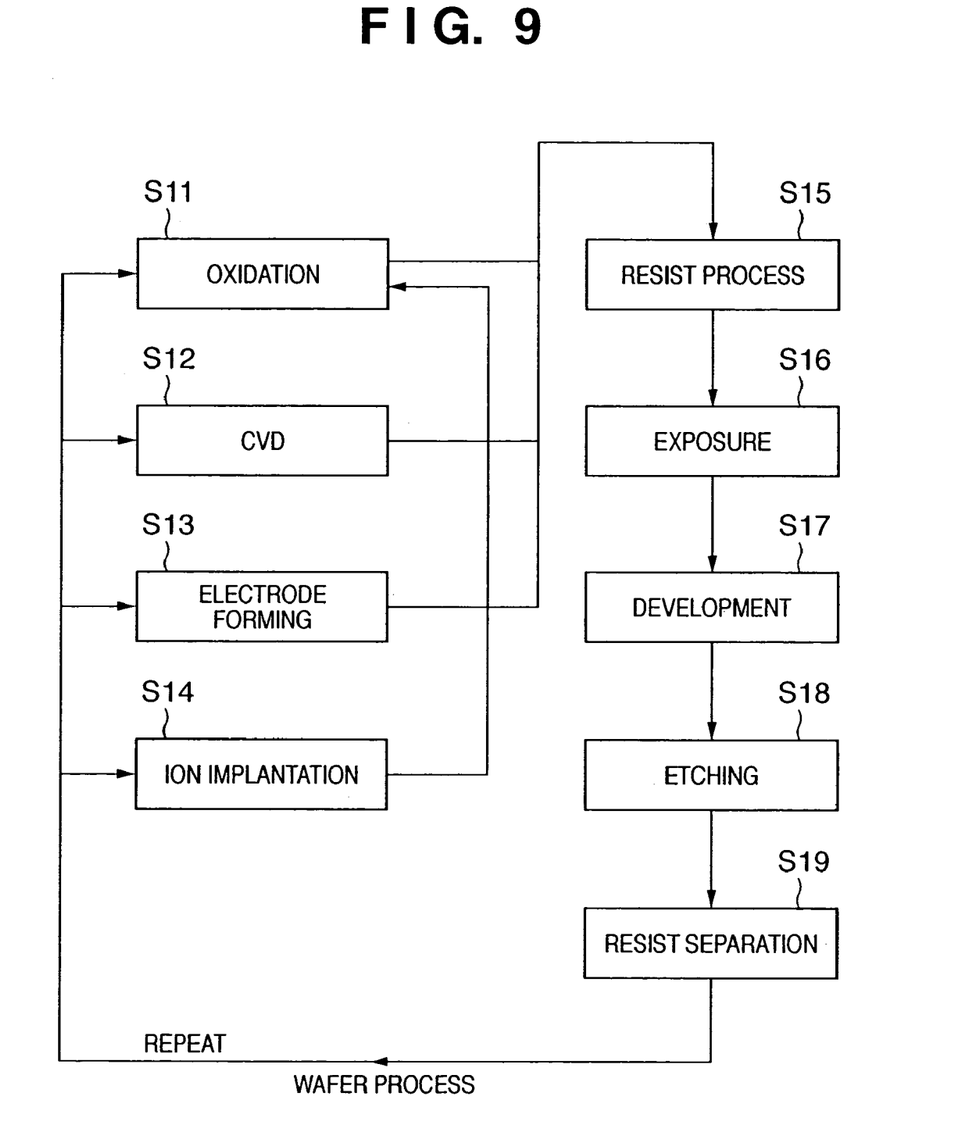
FIG. 9 is a block diagram explaining a flow of a detail device manufacturing process.

FIG. 9 shows a flow of the aforementioned wafer process in detail. In step 11 (oxidization), the wafer surface is oxidized. In step 12 (CVD), an insulating film is deposited on the wafer surface. In step 13 (electrode forming), electrodes are deposited on the wafer. In step 14 (ion implantation), ion is implanted on the wafer. In step 15 (resist process), a photosensitive agent is coated on the wafer. In step 16 (exposure), the circuit pattern is rendered (exposed) on the wafer by the above-described charged particle beam exposure apparatus. In step 17 (development), the exposed wafer is developed. In step 18 (etching), portions other than the developed resist image are removed. In step 19 (resist separation), unnecessary resist after the etching process is removed. By repeating the foregoing steps, multiple circuit patterns are formed on the wafer.

As many apparently widely different embodiments of the present invention can be made without departing from the spirit and scope thereof, it is to be understood that the invention is not limited to the specific embodiments thereof except as defined in the appended claims.

What is claimed is:

1. An electron beam source comprising:
    a cathode having a hemispherical electron discharge surface;
    an anode disposed opposite said cathode and having a first aperture on an optical axis;
    a first bias electrode disposed between said cathode and said anode, to which is applied an electric potential that is lower than an electric potential to said cathode, and having a second aperture on said optical axis that is larger than said electron discharge surface of said cathode;
    a second bias electrode disposed adjacent to said cathode as seen from said first bias electrode, to which is applied an electric potential that is lower than the electric potential to said cathode, and having a third aperture on said optical axis that is larger than said electron discharge surface of said cathode; and
    a controller that controls the electric potential applied to said first bias electrode and the electric potential applied to said second bias electrode.

2. The electron beam source according to claim 1, wherein a tip of said electron discharge surface of said cathode is disposed atop or outside a shell having a diameter equal to an inner diameter of said second aperture of said first bias electrode.

3. The electron beam source according to claim 1, wherein, in a case where a radius of said second aperture of said first bias electrode is R1, a radius of said third aperture of said second bias electrode is R2, a distance from the tip of said electron discharge surface of said cathode to a center of said second aperture of said first bias electrode is D1, and a distance from the center of said second aperture of said first bias electrode to a center of said third aperture of said second bias electrode on said optical axis is D2, a relation between R1 and R2 is $0.8R1 \leq R2 \leq 1.2R1$ and a relation between D1 and D2 is $0.8D1 \leq D2 \leq 1.2D1$.

4. The electron beam source according to claim 3, wherein said controller, in a case where the electric potential E1 applied to said first bias electrode is a relative electric potential relative to the electric potential of said cathode and the electric potential E2 applied to said second bias electrode is a relative electric potential relative to the electric potential of said cathode, controls the electric potential applied to said first bias electrode and the electric potential applied to said second bias electrode so as to maintain a relation between E1 and E2 such that $0.9k \leq |E1+E2| \leq 1.1k$, where k is a positive constant which has a unit of volts.

5. The electron beam source according to claim 3, wherein one or more bias electrodes, to which is applied an electric potential lower than the electric potential applied to said cathode, and which have an aperture on said optical axis larger than said electron discharge surface of said cathode, are aligned between said first bias electrode and said second bias electrode.

6. An electron beam exposure apparatus, comprising:
    the electron beam source according to claim 1;
    a formation system for applying an exposure beam having desired characteristics to an electron beam from said electron beam source;
    a deflection system for controlling a position of said exposure beam; and
    a projection system for concentrating said exposure beam on a substrate that is a specimen and drawing a desired pattern thereon.

* * * * *

UNITED STATES PATENT AND TRADEMARK OFFICE
CERTIFICATE OF CORRECTION

PATENT NO.        : 6,992,307 B2
APPLICATION NO. : 10/873250
DATED              : January 31, 2006
INVENTOR(S)       : Yoshikiyo Yui et al.

Page 1 of 1

It is certified that error appears in the above-identified patent and that said Letters Patent is hereby corrected as shown below:

COLUMN 1

Line 61, "are" should read --are at--.

COLUMN 5

Line 56, "(LaB6)," should read --(LaB$_6$),--.

COLUMN 7

Line 22, "(LaB6)" should read --(LaB$_6$)--.

COLUMN 8

Line 50, "arranging" should read --arranging them--.

COLUMN 9

Line 1, "apparatus" should read --apparatus.--.

Signed and Sealed this

Twenty-second Day of August, 2006

JON W. DUDAS
*Director of the United States Patent and Trademark Office*